United States Patent
Saito et al.

(10) Patent No.: US 11,619,659 B2
(45) Date of Patent: Apr. 4, 2023

(54) MAGNETIC SENSOR DEVICE, INVERTER APPARATUS, AND BATTERY APPARATUS

(71) Applicant: TDK CORPORATION, Tokyo (JP)

(72) Inventors: Yuta Saito, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/537,737

(22) Filed: Nov. 30, 2021

(65) Prior Publication Data
US 2022/0283201 A1    Sep. 8, 2022

(30) Foreign Application Priority Data

Mar. 8, 2021    (JP) .............................. JP2021-036337

(51) Int. Cl.
*G01R 15/20*    (2006.01)
*G01R 31/364*    (2019.01)

(52) U.S. Cl.
CPC ......... *G01R 15/207* (2013.01); *G01R 15/205* (2013.01); *G01R 31/364* (2019.01)

(58) Field of Classification Search
CPC .. G01R 15/207; G01R 15/205; G01R 31/364; Y02T 10/70; Y02T 10/72
See application file for complete search history.

(56) References Cited

U.S. PATENT DOCUMENTS

| | | | |
|---|---|---|---|
| 2011/0204889 A1* | 8/2011 | Nomura ................. | G01R 1/203 324/252 |
| 2012/0263985 A1* | 10/2012 | Murata ................. | G01R 15/207 324/252 |
| 2013/0057275 A1* | 3/2013 | Tamura ................. | B60L 3/0038 324/252 |

FOREIGN PATENT DOCUMENTS

| | | |
|---|---|---|
| JP | 2007-078416 A | 3/2007 |
| JP | 2011-169833 A | 9/2011 |

* cited by examiner

*Primary Examiner* — Dominic E Hawkins
(74) *Attorney, Agent, or Firm* — Oliff PLC

(57) ABSTRACT

A magnetic sensor device includes a first detection circuit that generates a first detection signal, a coil through which a feedback current is passed to generate a cancellation magnetic field, a second detection circuit that generates a second detection signal having a correspondence with a value of the feedback current, and a control circuit that controls the feedback current. In a closed-loop operation, the control circuit controls the feedback current so that the first detection signal has a constant value. In an open-loop operation, the control circuit maintains the feedback current at a constant value.

14 Claims, 9 Drawing Sheets

MAGNETIC SENSOR DEVICE, INVERTER APPARATUS, AND BATTERY APPARATUS

CROSS REFERENCE TO RELATED APPLICATIONS

This application claims the benefit of Japanese Priority Patent Application No. 2021-36337 filed on Mar. 8, 2021, the entire contents of which are incorporated herein by reference.

BACKGROUND

The technology relates to a magnetic sensor device, an inverter apparatus including the magnetic sensor device, and a battery apparatus including the magnetic sensor device.

Vehicles using an electric motor, such as electric vehicles, hybrid vehicles, and plug-in hybrid vehicles, are equipped with an inverter apparatus for controlling the electric motor and a battery apparatus for supplying high-voltage power to the electric motor via the inverter apparatus. The inverter apparatus and the battery apparatus use current sensors to measure the currents flowing through the circuits. Noncontact magnetic current sensors are known as current sensors used in circuits where a high current flows, such as in inverter apparatus and battery apparatus.

Among known magnetic current sensors are magnetic proportional current sensors and magnetic balance current sensors. A magnetic proportional current sensor has a magnetic sensor including a magnetic detection element. The magnetic sensor detects a target magnetic field generated by a current to be detected flowing through a conductor, and generates a detected value having a correspondence with the strength of the target magnetic field. The detected value of the magnetic sensor is proportional to the value of the current to be detected. The detected value of the magnetic sensor thus corresponds to the detected value of the current to be detected.

A magnetic balance current sensor includes a feedback coil, a magnetic sensor, a control circuit, and a detection circuit. The feedback coil generates a cancellation magnetic field for cancelling the target magnetic field generated by the current to be detected flowing through the conductor. The magnetic sensor detects a magnetic field that remains as a difference between the target magnetic field and the cancellation magnetic field (hereinafter, referred to as a residual magnetic field), and outputs the detected value of the residual magnetic field. The control circuit controls a feedback current to pass through the feedback coil based on the detected value output from the magnetic sensor. The detection circuit includes a resistor inserted into the current path of the feedback current. A potential difference across the resistor corresponds to the detected value of the feedback current. The detected value of the feedback current is proportional to the value of the current to be detected. The detected value of the feedback current thus corresponds to the detected value of the current to be detected. The magnetic balance current sensor operates so that the strength of the residual magnetic field approaches zero.

Inverter apparatuses and battery apparatuses in particular need a current sensor having a wide measurement range. US 2012/0263985 A1, JP 2007-78416 A, and JP 2011-169833 A disclose current sensors having a measurement range increased by combining a magnetic proportional system with a magnetic balance system.

For the efficient use of battery capacity, there are demands on battery apparatuses to accurately estimate the remaining battery level from the integrated value of the measured current value. To accurately estimate the remaining battery level, the current to be detected needs to be accurately measured in a domain where the value of the current to be detected is small i.e., where the strength of the target magnetic field is low in particular. The magnetic balance system in principle resolves the offset of the magnetic detection element and the nonlinearity of the magnetic detection element. In the domain where the strength of the target magnetic field is low, the current to be detected is therefore desirably measured by the magnetic balance system.

In JP 2007-78416 A, there are described that the current detection by the magnetic balance system is selected if the current to be detected is small, and that the value of the output signal (Hall voltage) from an integrated chip corresponding to the sensor output is proportional to the value of the current to be detected if the current to be detected is small. In JP 2011-169833 A, there are described that an output voltage corresponding to the characteristic of the magnetic balance current sensor is used as an output for the case where the current input range is relatively narrow, and that the value of the output voltage corresponding to the characteristic of the magnetic balance current sensor and the value of the output voltage of the magnetic proportional current sensor are both proportional to the value of the current to be detected in the small-current domain.

Current sensors used in vehicles can undergo a noise magnetic field whose strength changes instantaneously. Such a noise magnetic field will hereinafter be referred to as a pulsed noise magnetic field. Detection of the pulsed noise magnetic field is beneficial in view of anomaly detection, etc. However, no consideration has heretofore been given to the detection of the pulsed noise magnetic field by the current sensors. Magnetic balance current sensors in principle have a lower response speed than that of magnetic proportional current sensors. In other words, it is difficult for magnetic balance current sensors to detect a pulsed noise magnetic field since the detected value of the feedback current hardly changes even when a pulsed noise magnetic field is applied.

The foregoing problem is not limited to current sensors but applies to magnetic sensor devices in general that detect a target magnetic field.

SUMMARY

A magnetic sensor device according to one embodiment of the technology includes a first detection circuit that includes a magnetic detection element configured to detect an applied magnetic field, and generates a first detection signal having a correspondence with a strength of the applied magnetic field, a feedback coil through which a feedback current is passed to generate a cancellation magnetic field for cancelling at least part of a target magnetic field that is a magnetic field to be detected, a second detection circuit that generates a second detection signal having a correspondence with a value of the feedback current, and a control circuit that controls the feedback current and generates a detected value having a correspondence with a strength of the target magnetic field.

The control circuit is configured to execute a closed-loop operation if the strength of the target magnetic field is greater than a first value and less than a second value, and to execute an open-loop operation if the strength of the target magnetic field is less than or equal to the first value or greater than or equal to the second value. The closed-loop operation is an operation where the control circuit controls the feedback current so that the first detection signal has a constant value. The open-loop operation is an operation where the control circuit maintains the feedback current at a constant value. The control circuit generates the detected value based on the second detection signal during the execution of the closed-loop operation, and generates the detected value based on the first detection signal during the execution of the open-loop operation.

In the magnetic sensor device according to one embodiment of the technology, the control circuit may maintain, during the execution of the open-loop operation, the feedback current at a constant value so that the strength of the cancellation magnetic field has an absolute value equal to an absolute value of the first value or an absolute value of the second value.

In the magnetic sensor device according to one embodiment of the technology, the magnetic detection element may be a magnetoresistive element. The magnetoresistive element may be a tunnel magnetoresistive element.

In the magnetic sensor device according to one embodiment of the technology, the control circuit may be configured to detect a pulsed noise magnetic field superposed on the applied magnetic field by using the first detection signal or a signal obtained by combining the first detection signal with the second detection signal. The maximum value of the strength of the pulsed noise magnetic field may be greater than the second value. The minimum value of the strength of the pulsed noise magnetic field may be less than the first value.

In the magnetic sensor device according to one embodiment of the technology, a gradient of a change in the first detection signal with respect to a change in the strength of the target magnetic field during the execution of the open-loop operation may be different from or smaller than a gradient of a change in the second detection signal with respect to a change in the strength of the target magnetic field during the execution of the closed-loop operation.

The magnetic sensor device according to one embodiment of the technology may further include a shield configured to collect magnetic flux near the magnetic detection element.

In the magnetic sensor device according to one embodiment of the technology, the target magnetic field may be a magnetic field generated by a current to be detected flowing through a conductor. In such a case, the detected value may have a correspondence with the current to be detected. The conductor does not need to be provided with a magnetic core that collects magnetic flux generated by the current to be detected.

An inverter apparatus according to one embodiment of the technology includes the magnetic sensor device according to one embodiment of the technology and an inverter circuit including a conductor.

A battery apparatus according to one embodiment of the technology includes the magnetic sensor device according to one embodiment of the technology, a power supply circuit including a conductor, and a battery connected to the power supply circuit.

In the magnetic sensor device, the inverter apparatus, and the battery apparatus according to one embodiment of the technology, the control circuit controls the feedback current so that the first detection signal has a constant value during the execution of the closed-loop operation. According to one embodiment of the technology, a pulsed noise magnetic field can therefore be detected.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
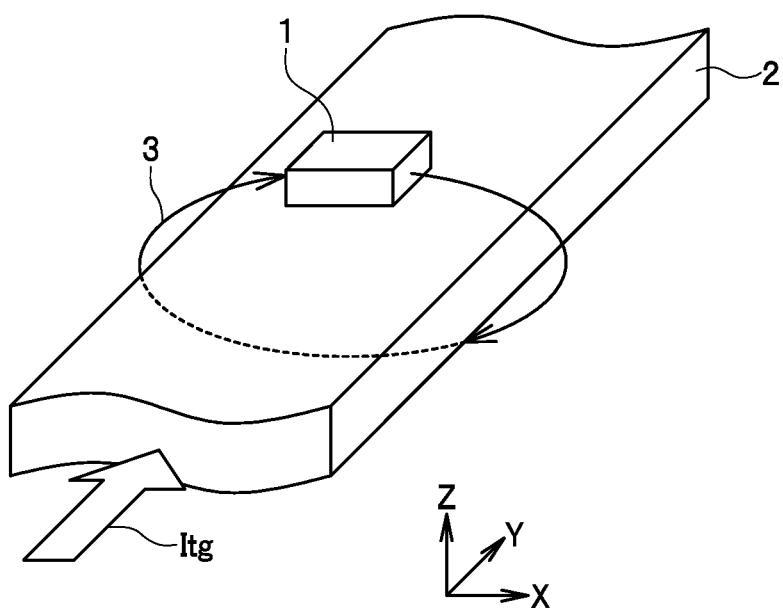
FIG. 1 is a perspective view showing a configuration of a current sensor system including a magnetic sensor device according to a first example embodiment of the technology.

An object of the technology is to provide a magnetic sensor device, an inverter apparatus, and a battery apparatus that are capable of detecting a pulsed noise magnetic field.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Example embodiments of the technology will now be described in detail with reference to the drawings. First, reference is made to FIG. 1 to describe a configuration of a current sensor system including a magnetic sensor device according to a first example embodiment of the technology. A magnetic sensor device 1 according to the present example embodiment is used as a current sensor for detecting the value of a current to be detected flowing through a conductor. FIG. 1 shows an example in which the conductor through which the current to be detected flows is a bus bar 2. The magnetic sensor device 1 is disposed near the bus bar 2. Hereinafter, the current to be detected will be referred to as target current Itg. The target current Itg generates a magnetic field 3 around the bus bar 2. The magnetic sensor device 1 is disposed at a position where the magnetic field 3 is applied.

The bus bar 2 does not contain a magnetic core that collects magnetic flux generated by the target current Itg. This enables miniaturization of the magnetic sensor device 1.

Figure 2:
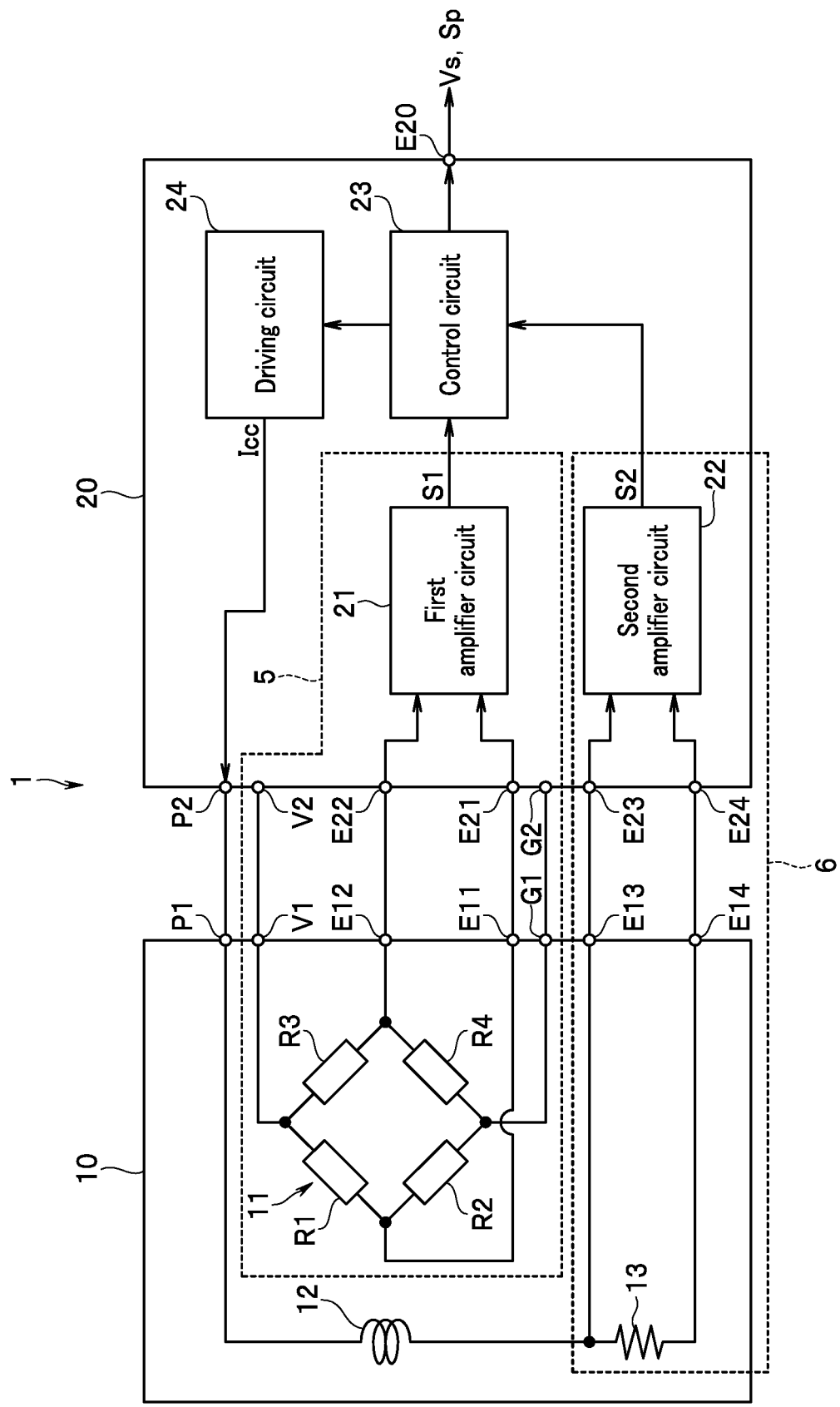
FIG. 2 is a block diagram showing a configuration of the magnetic sensor device according to the first example embodiment of the technology.
Figure 3:
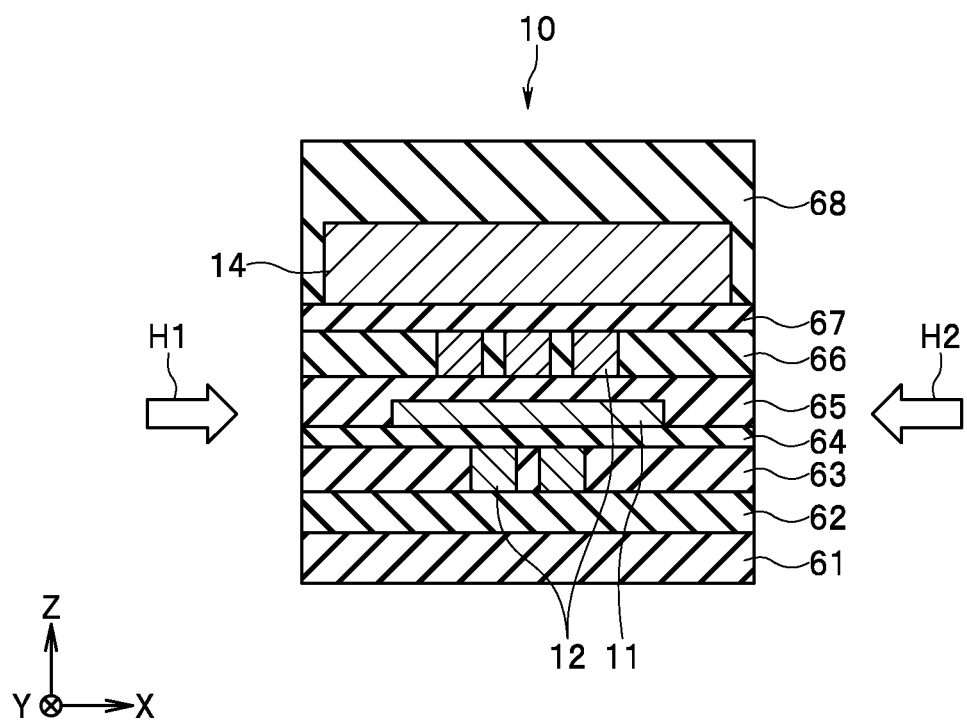
FIG. 3 is a cross-sectional view of the magnetic sensor of the first example embodiment of the technology.

The configuration of the magnetic sensor device 1 will now be described in detail with reference to FIG. 1 to FIG. 3. FIG. 2 is a block diagram showing the configuration of the magnetic sensor device 1. FIG. 3 is a cross-sectional view of the magnetic sensor. The magnetic sensor device 1 includes a first detection circuit 5, a feedback coil (hereinafter, referred to simply as a coil) 12, a second detection circuit 6, and a control circuit 23.

The first detection circuit 5 includes a magnetic detection element for detecting an applied magnetic field, and generates a first detection signal S1 having a correspondence with the strength of the applied magnetic field. Of the magnetic field 3 generated by the target current Itg, the magnetic field applied to the magnetic detection element of the first detection circuit 5 will be referred to as magnetic field to be detected or target magnetic field H1. The coil 12 is intended to generate a cancellation magnetic field H2 for cancelling at least part of the target magnetic field H1 when a feedback current Icc is passed. The second detection circuit 6 generates a second detection signal S2 having a correspondence with the value of the feedback current Icc.

The control circuit 23 controls the feedback current Icc and generates a detected value Vs having a correspondence with the strength of the target magnetic field H1. As will be described in detail later, the control circuit 23 generates the detected value Vs based on the first detection signal S1 or the second detection signal S2.

The section including the magnetic detection element and the coil 12 and the section including the control circuit 23 may be integrated or separate. In the present example embodiment, the two sections are configured as separate members. The section including the magnetic detection element and the coil 12 and the section including the control circuit 23 will hereinafter be referred to as a magnetic sensor 10 and a processor 20, respectively. The magnetic sensor 10 is independent of the bus bar 2. The processor 20 includes an application specific integrated circuit (ASIC) or a microcomputer, for example. The processor 20 may be located near the magnetic sensor 10 or at a distance from the magnetic sensor 10.

As shown in FIG. 2, the magnetic sensor 10 includes a Wheatstone bridge circuit 11 and a resistor 13 in addition to the coil 12. The Wheatstone bridge circuit 11 includes resistor sections R1, R2, R3, and R4 each including a magnetic detection element.

As shown in FIG. 3, the magnetic sensor 10 further includes a shield 14 located near the magnetic detection elements (in FIG. 3, the Wheatstone bridge circuit 11). The shield 14 is formed of a magnetic material and has a function of collecting magnetic flux. The application of the shield 14 can increase the range of the strength of the applied magnetic field detectable by the magnetic detection elements, i.e., the dynamic range. The Wheatstone bridge circuit 11, the coil 12, and the shield 14 are integrated by a plurality of insulating layers. The resistor 13 may be attached to the surface of the outermost insulating layer or embedded in the plurality of insulating layers.

Now, we define X, Y and Z directions as shown in FIG. 1 and FIG. 2. The X, Y and Z directions are orthogonal to one another. As employed in the present application, "orthogonal" shall be a concept that covers not only being perfectly orthogonal at 90° but also being substantially orthogonal, i.e., orthogonal with a slight deviation from 90°. In this embodiment, the target current Itg shown in FIG. 1 flows in the Y direction. The opposite directions to the X, Y, and Z directions will be referred to as −X, −Y, and −Z directions, respectively. As used herein, the term "above" refers to positions located forward of a reference position in the Z direction, and "below" refers to positions located on a side of the reference position opposite to "above".

The magnetic sensor 10 is disposed above or below the bus bar 2. FIG. 1 shows an example where the magnetic sensor device 1 including the magnetic sensor 10 is disposed above the bus bar 2.

As shown in FIG. 3, the magnetic sensor 10 further includes a substrate 61, and insulating layers 62, 63, 64, 65, 66, 67, and 68. The insulating layers 62, 63, and 64 are stacked on the substrate 61. The Wheatstone bridge circuit 11 is placed on the insulating layer 64. The insulating layer 65 is disposed on the insulating layer 64 to cover the Wheatstone bridge circuit 11. The insulating layers 66 and 67 are stacked on the insulating layer 65. The shield 14 is placed on the insulating layer 67. The insulating layer 68 is disposed on the insulating layer 67 to cover the shield 14. The coil 12 is embedded in the insulating layers 63 to 66.

As shown in FIG. 2, the magnetic sensor 10 includes ports E11, E12, E13, E14, G1, P1, and V1. The resistor sections R1 and R2 of the Wheatstone bridge circuit 11 are connected to the port E11 at one end each. The resistor sections R3 and R4 of the Wheatstone bridge circuit 11 are connected to the port E12 at one end each. The other ends of the resistor sections R1 and R3 are connected to the port V1. The other ends of the resistor sections R2 and R4 are connected to the port G1.

One end of the coil 12 is connected to the port P1. The other end of the coil 12 and one end of the resistor 13 are connected to the port E13. The other end of the resistor 13 is connected to the port E14.

As shown in FIG. 2, the processor 20 includes ports E20, E21, E22, E23, E24, G2, P2, and V2. The ports E21, E22, E23, E24, G2, P2, and V2 are connected to the ports E11, E12, E13, E14, G1, P1, and V1 of the magnetic sensor 10, respectively. A power supply voltage of predetermined magnitude to be supplied to the Wheatstone bridge circuit 11 of the magnetic sensor 10 is applied to the port V2. The port G2 is grounded. The control circuit 23 outputs the detected value Vs to the port E20.

The processor 20 also includes a first amplifier circuit 21, a second amplifier circuit 22, and a driving circuit 24 in addition to the control circuit 23. The first and second amplifier circuits 21 and 22 each include two input nodes and an output node. The two input nodes of the first amplifier circuit 21 are connected to the ports E21 and E22. The two input nodes of the second amplifier circuit 22 are connected to the ports E23 and E24. The output node of the first amplifier circuit 21 and the output node of the second amplifier circuit 22 are connected to the control circuit 23.

The driving circuit 24 is a circuit for supplying the feedback current Icc to the coil 12. The control circuit 23 controls the feedback current Icc by controlling the driving circuit 24. The feedback current Icc is supplied to the coil 12 via the ports P1 and P2.

The first detection circuit 5 includes the Wheatstone bridge circuit 11 of the magnetic sensor 10 and the first amplifier circuit 21 of the processor 20. The second detection circuit 6 includes the resistor 13 of the magnetic sensor 10 and the second amplifier circuit 22 of the processor 20.

Next, the magnetic detection elements included in the first detection circuit 5 will be described. The magnetic detection elements may be Hall elements or magnetoresistive elements. In view of response speed, the magnetic detection elements are desirably magnetoresistive elements. A magnetoresistive element will hereinafter be referred to as an MR element. The MR element may be a spin-valve MR element or an anisotropic magnetoresistive (AMR) element. In particular, in the present example embodiment, the first detection circuit 5 includes a spin-valve MR elements 50 as the magnetic detection elements.

Figure 4:
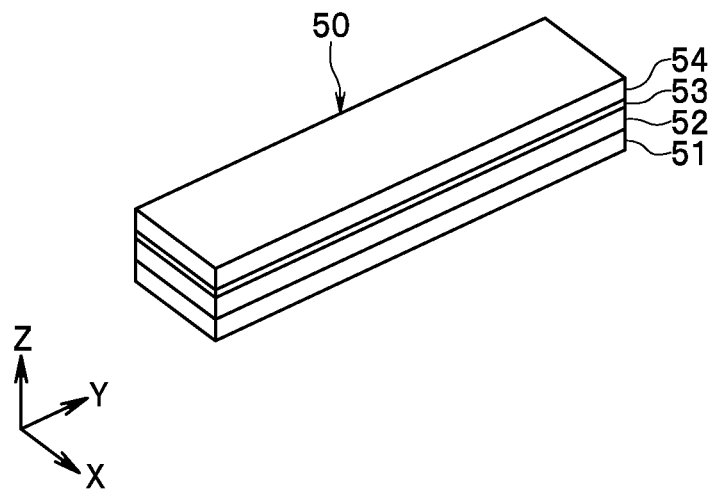
FIG. 4 is a perspective view showing a magnetoresistive element of the magnetic sensor device according to the first example embodiment of the technology.

FIG. 4 is a perspective view showing the MR element 50. The MR element 50 includes a magnetization pinned layer 52 having a magnetization whose direction is fixed, a free layer 54 having a magnetization whose direction is variable depending on the direction of an applied magnetic field, and a gap layer 53 located between the magnetization pinned layer 52 and the free layer 54. The MR element 50 may be a tunnel magnetoresistive (TMR) element or a giant magnetoresistive (GMR) element. In view of response speed and precision, the MR element 50 is desirably a TMR element. In the TMR element, the gap layer 53 is a tunnel barrier layer. In the GMR element, the gap layer 53 is a nonmagnetic conductive layer. The resistance of the MR element 50 changes with an angle that the direction of the magnetization of the free layer 54 forms with respect to the direction of the magnetization of the magnetization pinned layer 52. The resistance is minimized if the angle is 0°. The resistance is maximized if the angle is 180°. In the MR element 50, the free layer 54 has a shape anisotropy that sets the direction of the magnetization easy axis to be orthogonal to the magnetization direction of the magnetization pinned layer 52.

The MR element 50 further includes an antiferromagnetic layer 51. The antiferromagnetic layer 51, the magnetization pinned layer 52, the gap layer 53, and the free layer 54 are stacked in this order. The layers 51 to 54 of the MR element 50 may be arranged in a reverse order to that shown in FIG. 4. The antiferromagnetic layer 51 is made of an antiferromagnetic material. The antiferromagnetic layer 51 is in exchange coupling with the magnetization pinned layer 52 so as to pin the magnetization direction of the magnetization pinned layer 52. The magnetization pinned layer 52 may be a so-called self-pinned layer (synthetic ferri pinned layer, or SFP layer). The self-pinned layer has a layered ferri structure including a stack of a ferromagnetic layer, a nonmagnetic intermediate layer, and a ferromagnetic layer. The two ferromagnetic layers are coupled in an antiferromagnetic manner. If the magnetization pinned layer 52 is a self-pinned layer, the antiferromagnetic layer 51 may be omitted.

Each of the resistor sections R1 to R4 of the Wheatstone bridge circuit 11 includes at least one MR element 50. The magnetization pinned layer 52 of the MR element 50 of each of the resistor sections R1 and R4 has a first magnetization direction. The magnetization pinned layer 52 of the MR element 50 of each of the resistor sections R2 and R3 has a second magnetization direction opposite to the first magnetization direction.

Next, the position and orientation of the magnetic sensor 10 will be described. The magnetic field 3 generated by the target current Itg and a magnetic field generated by the coil 12 are applied to the magnetic sensor 10. The magnetic sensor 10 is positioned such that the directions of the aforementioned two magnetic fields to be applied thereto are opposite or substantially opposite to each other.

As employed herein, a direction parallel to the directions of the foregoing two magnetic fields applied to the magnetic sensor 10 will be referred to as a magnetic sensing direction. The target magnetic field H1 is a component of the magnetic field 3 generated by the target current Itg and is applied to the magnetic sensor 10, in a direction parallel to the magnetic sensing direction. The cancellation magnetic field H2 is a component of the magnetic field generated by the coil 12 and is applied to the magnetic sensor 10, in a direction parallel to the magnetic sensing direction.

In general, a planar Hall element tends to have a sensitive axis perpendicular to its substrate. An MR element and a vertical Hall element tend to have a sensitive axis parallel to their substrates. If the MR element is a TMR element or GMR element, the magnetic sensing direction is typically a direction parallel to the magnetization direction of the magnetization pinned layer. If the MR element 50 is a TMR element or GMR element, the magnetic sensor 10 is therefore located so that the first and second magnetization directions are parallel or substantially parallel to the magnetic sensing direction.

Suppose that the direction of the target magnetic field H1 and the direction of the cancellation magnetic field H2 are parallel to the X direction. In such a case, the magnetic sensor 10 is located so that the first magnetization direction is the X direction and the second magnetization direction is the −X direction, for example. In view of the manufacturing accuracy of the MR elements 50 and the alignment accuracy of the magnetic sensor 10, the first and second magnetization directions may be slightly different from the foregoing directions.

The free layer 54 of the MR element 50 desirably has shape anisotropy with an easy axis in a direction intersecting the magnetic sensing direction. The easy axis can be oriented to the direction intersecting the magnetic sensing direction by providing a magnet that applies a bias magnetic field to the free layer 54 of the MR element 50.

Next, an operation of the control circuit 23 will be described. The control circuit 23 can select a closed-loop operation and an open-loop operation. The closed-loop operation is an operation where the control circuit 23 controls the feedback current Icc so that the first detection signal S1 has a constant value. The open-loop operation is an operation where the control circuit 23 maintains the feedback current Icc at a constant value. During the execution of the closed-loop operation, the magnetic sensor device 1 operates as a magnetic balance current sensor. During the execution of the open-loop operation, the magnetic sensor device 1 operates as a magnetic proportional current sensor.

As the strength of the applied magnetic field changes, a potential difference between the ports E11 and E12 of the magnetic sensor 10 changes. A potential difference between the ports E21 and E22 of the processor 20 thus changes accordingly. The first amplifier circuit 21 outputs a signal corresponding to the potential difference between the ports E21 and E22 as the first detection signal S1. If there is no noise magnetic field, the applied magnetic field is a magnetic field that remains from the difference between the target magnetic field H1 and the cancellation magnetic field H2 (hereinafter, referred to as a residual magnetic field). During the execution of the closed-loop operation, the control circuit 23 controls the feedback current Icc based on the value of the first detection signal S1 so that the strength of the residual magnetic field approaches zero. The value of the first detection signal S1 is thereby maintained at a constant value (for example, zero) during the execution of the closed-loop operation.

As the value of the feedback current Icc changes, a potential difference between the ports E13 and E14 of the magnetic sensor 10 changes. A potential difference between the ports E23 and E24 of the processor 20 thus changes accordingly. The second amplifier circuit 22 outputs a signal corresponding to the potential difference between the ports E23 and E24 as the second detection signal S2. During the execution of the closed-loop operation, the value of the second detection signal S2 has a correspondence with the strength of the target magnetic field H1 and the value of the target current Itg. During the execution of the closed-loop operation, the control circuit 23 generates the detected value Vs based on the second detection signal S2. For example, the detected value Vs is generated by making predetermined corrections, such as a gain adjustment and an offset adjustment, to the second detection signal S2.

During the execution of the open-loop operation, the control circuit 23 maintains the feedback current Icc at a constant value. The strength of the residual magnetic field therefore changes with the strength of the target magnetic field H1 during the execution of the open-loop operation. During the execution of the open-loop operation, the value of the first detection signal S1 has a correspondence with the strength of the target magnetic field H1 and the value of the target current Itg. During the execution of the open-loop operation, the control circuit 23 generates the detected value Vs based on the first detection signal S1. For example, the detected value Vs is generated by making predetermined corrections, such as a gain adjustment and an offset adjustment, to the first detection signal S1.

In particular, in the present example embodiment, the control circuit 23 is configured to execute the closed-loop operation if the strength of the target magnetic field H1 is greater than the first value and less than the second value, and execute the open-loop operation if the strength of the target magnetic field H1 is less than or equal to the first value or greater than or equal to the second value. During the execution of the closed-loop operation, the control circuit 23 controls the feedback current Icc so that the strength of the residual magnetic field becomes zero, i.e., the target magnetic field H1 is completely cancelled out by the cancellation magnetic field H2. During the execution of the open-loop operation, the control circuit 23 maintains the feedback current Icc at a constant value so that part of the target magnetic field H1 is cancelled by the cancellation magnetic field H2.

As employed herein, the strength of a magnetic field whose direction is the X direction is expressed by a positive value, and the strength of a magnetic field whose direction is the −X direction is expressed by a negative value. In the present example embodiment, the first value is a negative value, and the second value is a positive value.

Figure 5:
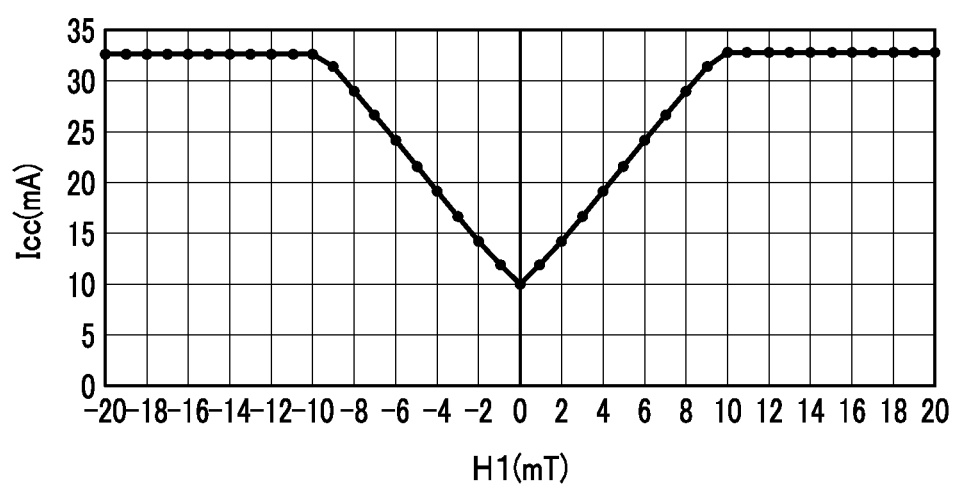
FIG. 5 is a characteristic chart showing a relationship between a target magnetic field and a feedback current of the first example embodiment of the technology.

FIG. 5 is a characteristic chart showing a relationship between the strength of the target magnetic field H1 and the feedback current Icc. The horizontal axis and the vertical axis of FIG. 5 indicate the strength of the target magnetic field H1, and the feedback current Icc, respectively. In FIG. 5, the strength of the target magnetic field H1 is expressed in terms of the value of a magnetic flux density corresponding to the strength of the target magnetic field H1. In the following description, the strength of a magnetic field will be expressed in terms of the value of a magnetic flux density corresponding to the strength of the magnetic field. When the direction of the target magnetic field H1 is the −X direction (the direction of the cancellation magnetic field H2 is the X direction), the direction of the feedback current Icc flowing through the coil 12 is reverse to that of when the direction of the target magnetic field H1 is the X direction (the direction of the cancellation magnetic field H2 is the −X direction). Note that FIG. 5 shows the values of the feedback current Icc positive regardless of the direction of the feedback current Icc.

In the example shown in FIG. 5, the first value is −10 mT and the second value is 10 mT. As shown in FIG. 5, if the strength of the target magnetic field H1 increases from zero, the feedback current Icc increases as the strength of the target magnetic field H1 increases until the strength of the target magnetic field H1 reaches 10 mT. If the strength of the target magnetic field H1 is greater than or equal to 10 mT, the feedback current Icc is maintained at a constant value. If the strength of the target magnetic field H1 is greater than or equal to 10 mT, the control circuit 23 maintains the feedback current Icc at the constant value so that the strength of the cancellation magnetic field H2 has the same absolute value as that of the second value (10 mT).

Similarly, if the strength of the target magnetic field H1 decreases from zero, the feedback current Icc increases as the strength of the target magnetic field H1 decreases until the strength of the target magnetic field H1 reaches −10 mT. If the strength of the target magnetic field H1 is less than or equal to −10 mT, the feedback current Icc is maintained at a constant value. If the strength of the target magnetic field H1 is less than or equal to −10 mT, the control circuit 23 maintains the feedback current Icc at the constant value so that the strength of the cancellation magnetic field H2 has the same absolute value as that of the first value (10 mT).

Figure 6:
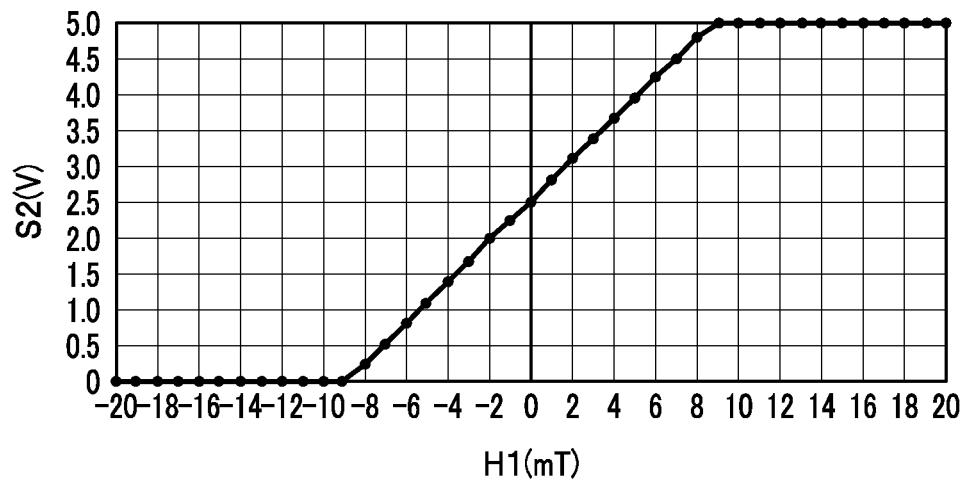
FIG. 6 is a characteristic chart showing a relationship between the target magnetic field and a second detection signal of the first example embodiment of the technology.

FIG. 6 is a characteristic chart showing a relationship between the strength of the target magnetic field H1 and the second detection signal S2. The horizontal axis and the vertical axis of FIG. 6 indicate the strength of the target magnetic field H1, and the second detection signal S2, respectively. As shown in FIG. 6, if the strength of the target magnetic field H1 is greater than −10 mT and less than 10 mT, the second detection signal S2 changes with the strength of the target magnetic field H1. If the strength of the target magnetic field H1 is less than or equal to −10 mT or greater than or equal to 10 mT, the second detection signal S2 has a constant value regardless of the strength of the target magnetic field H1.

Figure 7:
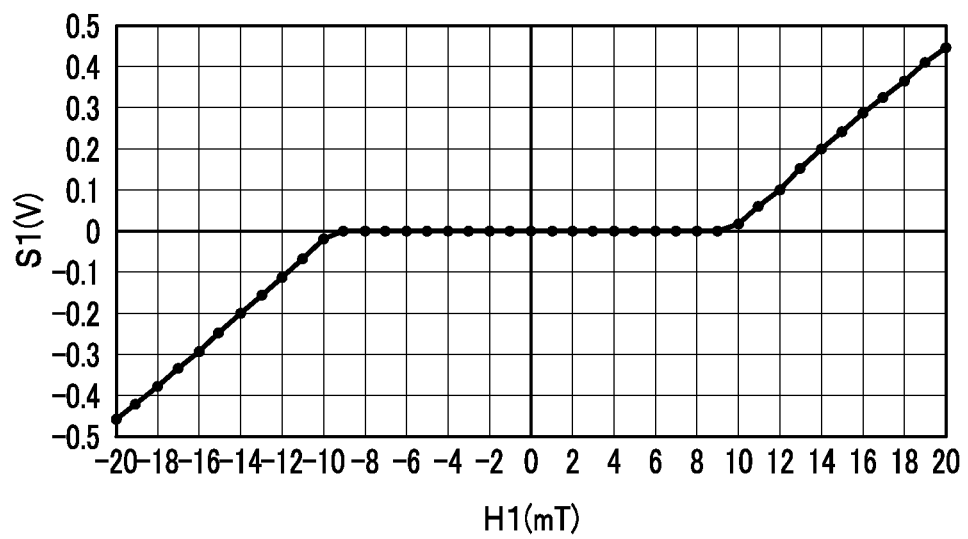
FIG. 7 is a characteristic chart showing a relationship between the target magnetic field and a first detection signal of the first example embodiment of the technology.

FIG. 7 is a characteristic chart showing a relationship between the strength of the target magnetic field H1 and the first detection signal S1. The horizontal axis and the vertical axis of FIG. 7 indicate the strength of the target magnetic field H1, and the first detection signal S1, respectively. As shown in FIG. 7, if the strength of the target magnetic field H1 is greater than −10 mT and less than 10 mT, the first detection signal S1 has a constant value regardless of the strength of the target magnetic field H1. If the strength of the target magnetic field H1 is less than or equal to −10 mT or greater than or equal to 10 mT, the first detection signal S1 changes with the strength of the target magnetic field H1.

The gradient of a change in the first detection signal S1 with respect to a change in the strength of the target magnetic field H1 during the execution of the open-loop operation may be different from the gradient of a change in the second detection signal S2 with respect to a change in the strength of the target magnetic field H1 during the execution of the closed-loop operation. In the example shown in FIGS. 6 and 7, the gradient of a change in the first detection signal S1 with respect to a change in the strength of the target magnetic field H1 during the execution of the open-loop operation is smaller than the gradient of a change in the second detection signal S2 with respect to a change in the strength of the target magnetic field H1 during the execution of the closed-loop operation.

The function and effect of the magnetic sensor device 1 according to the present example embodiment will now be described. In the present example embodiment, the control circuit 23 is configured to execute the closed-loop operation if the strength of the target magnetic field H1 is greater than the first value and less than the second value. In other words, in the present example embodiment, the magnetic sensor device 1 is configured to operate as a magnetic balance current sensor in a domain where the absolute value of the strength of the target magnetic field H1 is small. According to the present example embodiment, the target current Itg can thus be accurately detected in the domain where the strength of the target magnetic field H1 is low. During the execution of the closed-loop operation, the second detection signal S2 corresponds to the detected value of the magnetic balance current sensor.

In the present example embodiment, the control circuit 23 is configured to execute the open-loop operation if the strength of the target magnetic field H1 is less than or equal to the first value or greater than or equal to the second value. In other words, in the present example embodiment, the magnetic sensor device 1 is configured to operate as a magnetic proportional current sensor in a domain where the absolute value of the strength of the target magnetic field H1 is large. According to the present example embodiment, the measurement range of the target current Itg can be increased. The first detection signal S1 during the execution of the open-loop operation corresponds to the detected value of the magnetic proportional current sensor.

Figure 8A:
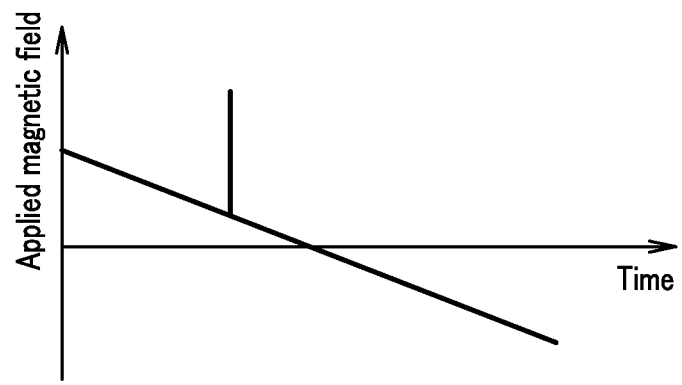
FIGS. 8A and 8B are schematic diagrams showing an applied magnetic field and a pulsed noise magnetic field of the first example embodiment of the technology.
Figure 8B:
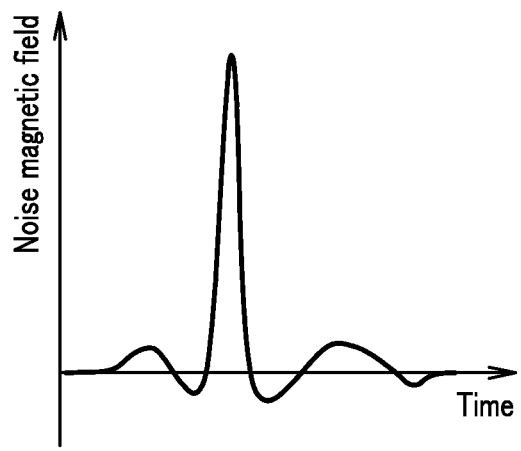

According to the present example embodiment, a noise magnetic field whose strength changes instantaneously (pulsed noise magnetic field) can be detected. This effect will now be described with reference to FIGS. 8A to 9B. FIGS. 8A and 8B are schematic diagrams showing an applied magnetic field and a pulsed noise magnetic field. FIG. 8A shows the applied magnetic field on which the pulsed noise magnetic field is superposed. FIG. 8B shows the pulsed noise magnetic field in an enlarged manner.

Figure 9A:
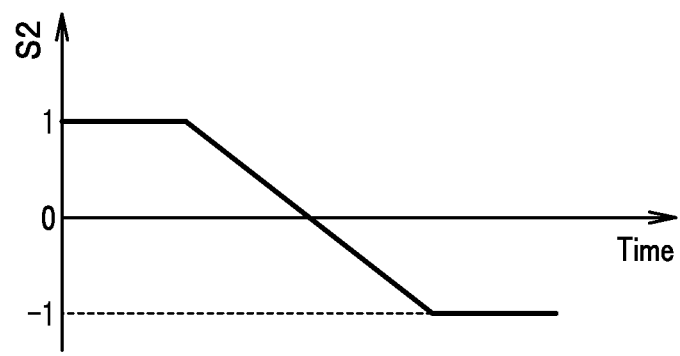
FIGS. 9A and 9B are schematic diagrams showing first and second detection signals when the pulsed noise magnetic field is superposed on the applied magnetic field of the first example embodiment of the technology.
Figure 9B:
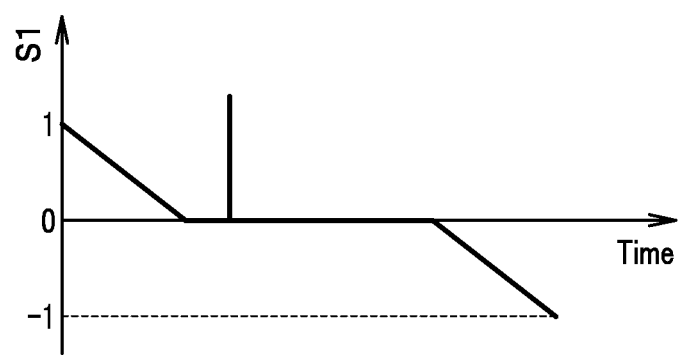

FIGS. 9A and 9B are schematic diagrams showing the first and second detection signals S1 and S2 when the pulsed noise magnetic field is superposed on the applied magnetic field. FIG. 9A shows the second detection signal S2. FIG. 9B shows the first detection signal S1. In FIG. 9A, the second detection signal S2 is normalized so that the maximum value of the second detection signal S2 without the noise magnetic field is 1 and the minimum value of the second detection signal S2 without the noise magnetic field is −1. In FIG. 9B, the first detection signal S1 is normalized so that the maximum value of the first detection signal S1 without the noise magnetic field is 1 and the minimum value of the first detection signal S1 without the noise magnetic field is −1.

FIGS. 8A and 9B show an example where a pulsed noise magnetic field that instantaneously increases the strength of the applied magnetic field occurs during the execution of the closed-loop operation. The second detection signal S2 changes with the feedback current Icc. The feedback current Icc is controlled by the control circuit 23 and the driving circuit 24. The second detection signal S2 thus has a low response speed in principle. As shown in FIG. 9A, the second detection signal S2 therefore changes little despite the superposition of the pulsed noise magnetic field.

In contrast, the first detection signal S1 has a higher response speed than that of the second detection signal S2 since the control by the control circuit 23 and the driving circuit 24 is not involved. In particular, in the present example embodiment, the high-precision MR elements 50 (TMR elements) having high response speed are used as the magnetic detection elements. As shown in FIG. 9B, if the pulsed noise magnetic field is superposed, the value of the first detection signal S1 changes in response to the pulsed noise magnetic field. Although not shown in the drawings, the value of the first detection signal S1 also changes in response to the pulsed noise magnetic field if the pulsed noise magnetic field is superposed during the execution of the open-loop operation. The pulsed noise magnetic field can thus be detected by monitoring the first detection signal S1.

The control circuit 23 may be configured so that a signal Sp indicating the detection of the pulsed noise magnetic field can be output to the port E20 or a not-shown port.

Note that FIGS. 8A and 9B show the case where a pulsed noise magnetic field that increases the strength of the applied magnetic field is superposed. However, the foregoing description made with reference to FIGS. 8A and 9B is also applied to a case where a pulsed noise magnetic field that reduces the strength of the applied magnetic field is superposed.

If the pulsed noise magnetic field is a magnetic field that instantaneously increases the strength of the applied magnetic field, the maximum value of the strength of the pulsed noise magnetic field may be greater than the second value. Similarly, if the pulsed noise magnetic field is a magnetic field that instantaneously reduces the strength of the applied magnetic field, the minimum value of the strength of the pulsed noise magnetic field may be less than the first value.

In particular, in the present example embodiment, the control circuit 23 controls the feedback current Icc so that the first detection signal S1 has a constant value during the execution of the closed-loop operation. According to the present example embodiment, a pulsed noise magnetic field having low strength can thus be easily detected compared to the case where the pulsed noise magnetic field is detected based on a signal changing with the target magnetic field H1.

As in the example shown in FIGS. 6 and 7, the gradient of a change in the first detection signal S1 with respect to a change in the strength of the target magnetic field H1 during the execution of the open-loop operation may be smaller than the gradient of a change in the second detection signal S2 with respect to a change in the strength of the target magnetic field H1 during the execution of the closed-loop operation. This also facilitates the detection of the pulsed noise magnetic field having low strength.

To detect the pulsed noise magnetic field, the control circuit 23 may use a signal obtained by combining the first detection signal S1 with the second detection signal S2 in addition to or instead of the first detection signal S1.

Figure 10:
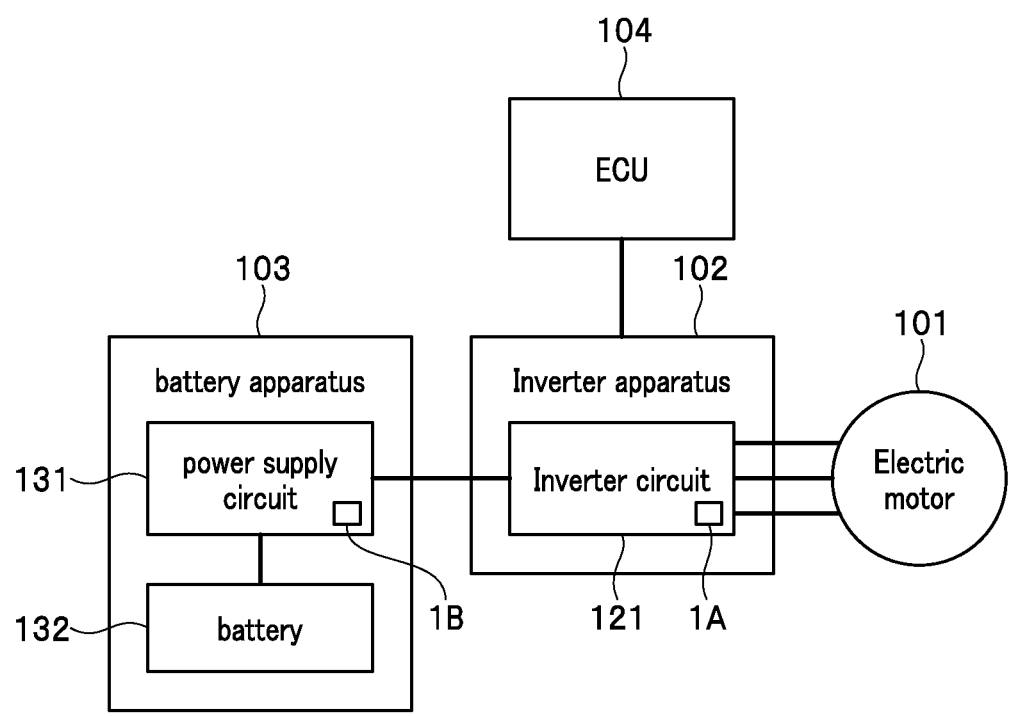
FIG. 10 is a block diagram showing a configuration of an inverter apparatus and a battery apparatus according to the first example embodiment of the technology.

Next, an inverter apparatus and a battery apparatus according to the present example embodiment will be described. Here, an inverter apparatus and a battery apparatus for use in a vehicle using an electric motor will be described as an example. FIG. 10 is a block diagram showing a configuration of the inverter apparatus and the battery apparatus. As shown in FIG. 10, an electric motor 101 is connected to an inverter apparatus 102 that controls the electric motor 101. A battery apparatus 103 is connected to the inverter apparatus 102. The battery apparatus 103 supplies high-voltage power to the electric motor 101 via the inverter apparatus 102. An electronic control unit (ECU) 104 is also connected to the inverter apparatus 102.

The inverter apparatus 102 includes an inverter circuit 121 and a magnetic sensor device 1A. The inverter circuit 121 includes a conductor through which a current to be detected flows. The magnetic sensor device 1A detects the current to be detected flowing through the conductor of the inverter circuit 121, and generates a detected value having a correspondence with the current to be detected. The magnetic sensor device 1A has the same configuration as that of the magnetic sensor device 1 described with reference to FIGS. 1 to 4.

The battery apparatus 103 includes a power supply circuit 131, a battery 132, and a magnetic sensor device 1B. The power supply circuit 131 includes a conductor through which a current to be detected flows. The magnetic sensor device 1B detects the current to be detected flowing through the conductor of the power supply circuit 131, and generates a detected value having a correspondence with the current to be detected. The magnetic sensor device 1B has the same configuration as that of the magnetic sensor device 1 described with reference to FIGS. 1 to 4.

Second Example Embodiment

Figure 11:
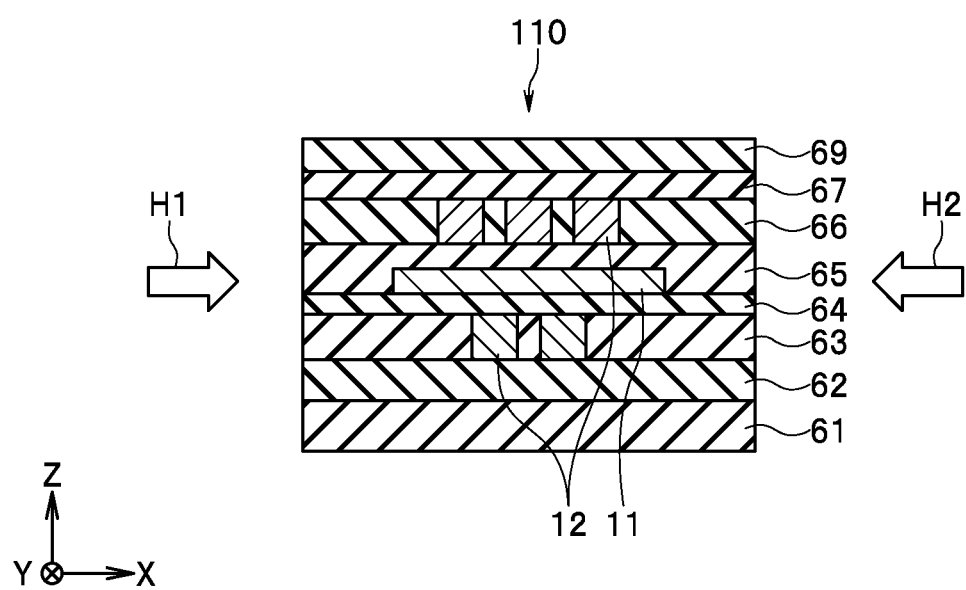
FIG. 11 is a cross-sectional view of a magnetic sensor of a second example embodiment of the technology.

A second example embodiment of the technology will now be described. FIG. 11 is a cross-sectional view showing a magnetic sensor of a magnetic sensor device according to the present example embodiment. A magnetic sensor device 1 according to the present example embodiment includes a magnetic sensor 110 instead of the magnetic sensor 10 of the first example embodiment. The magnetic sensor 110 does not include the shield 14 or the insulating layer 68 of the first example embodiment. Instead, the magnetic sensor 110 includes an insulating layer 69 disposed on the insulating layer 67. In other respects, the configuration of the magnetic sensor 110 is the same as that of the magnetic sensor 10 of the first example embodiment.

In the present example embodiment, the shield 14 is not provided. According to the present example embodiment, the gradient of a change in the first detection signal S1 with respect to a change in the strength of each of the target magnetic field H1 and the applied magnetic field can thereby be increased. According to the present example embodiment, a pulsed noise magnetic field can thus be detected more effectively.

The configuration, operation and effects of the present example embodiment are otherwise the same as those of the first example embodiment.

The technology is not limited to the foregoing embodiments, and various modification examples may be made thereto. For example, the magnetic sensor device according to the technology can also be applied if the target magnetic field is not the one generated by a current.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetic sensor device comprising:
   a first detection circuit that includes a magnetic detection element configured to detect an applied magnetic field, and generates a first detection signal having a correspondence with a strength of the applied magnetic field;
   a feedback coil through which a feedback current is passed to generate a cancellation magnetic field for cancelling at least part of a target magnetic field that is a magnetic field to be detected;
   a second detection circuit configured to generate a second detection signal having a correspondence with a value of the feedback current; and
   a control circuit configured to control the feedback current and generate a detected value having a correspondence with a strength of the target magnetic field, wherein
   the control circuit is configured to execute a closed-loop operation if the strength of the target magnetic field is greater than a first value and less than a second value, and to execute an open-loop operation if the strength of the target magnetic field is less than or equal to the first value or greater than or equal to the second value,
   the closed-loop operation is an operation where the control circuit controls the feedback current so that the first detection signal has a constant value,
   the open-loop operation is an operation where the control circuit maintains the feedback current at a constant value, and
   the control circuit generates the detected value based on the second detection signal during the execution of the closed-loop operation, and generates the detected value based on the first detection signal during the execution of the open-loop operation.

2. The magnetic sensor device according to claim 1, wherein the control circuit maintains, during the execution of the open-loop operation, the feedback current at a constant value so that the strength of the cancellation magnetic field has an absolute value equal to an absolute value of the first value or an absolute value of the second value.

3. The magnetic sensor device according to claim 1, wherein the magnetic detection element is a magnetoresistive element.

4. The magnetic sensor device according to claim 3, wherein the magnetoresistive element is a tunnel magnetoresistive element.

5. The magnetic sensor device according to claim 1, wherein the control circuit is configured to detect a pulsed noise magnetic field superposed on the applied magnetic field by using the first detection signal or a signal obtained by combining the first detection signal with the second detection signal.

6. The magnetic sensor device according to claim 5, wherein the maximum value of the strength of the pulsed noise magnetic field is greater than the second value.

7. The magnetic sensor device according to claim 5, wherein the minimum value of the strength of the pulsed noise magnetic field is less than the first value.

8. The magnetic sensor device according to claim 1, wherein a gradient of a change in the first detection signal with respect to a change in the strength of the target magnetic field during the execution of the open-loop operation is different from a gradient of a change in the second detection signal with respect to a change in the strength of the target magnetic field during the execution of the closed-loop operation.

9. The magnetic sensor device according to claim 8, wherein the gradient of the change in the first detection signal with respect to the change in the strength of the target magnetic field during the execution of the open-loop operation is smaller than the gradient of the change in the second detection signal with respect to the change in the strength of the target magnetic field during the execution of the closed-loop operation.

10. The magnetic sensor device according to claim 1, further comprising a shield configured to collect magnetic flux near the magnetic detection element.

11. The magnetic sensor device according to claim 1, wherein
   the target magnetic field is a magnetic field generated by a current to be detected flowing through a conductor, and
   the detected value has a correspondence with the current to be detected.

12. The magnetic sensor device according to claim 11, wherein the conductor is not provided with a magnetic core that collects magnetic flux generated by the current to be detected.

13. An inverter apparatus comprising:
   the magnetic sensor device according to claim 11; and
   an inverter circuit including the conductor.

14. A battery apparatus comprising:
   the magnetic sensor device according to claim 11;
   a power supply circuit including the conductor; and
   a battery connected to the power supply circuit.

* * * * *